United States Patent [19]

Conan

[11] Patent Number: 5,247,481
[45] Date of Patent: Sep. 21, 1993

[54] MEMORY INTEGRATED CIRCUIT WITH REDUNDANCY AND IMPROVED ADDRESSING IN TEST MODE

[75] Inventor: Bertrand Conan, Aix en Provence, France

[73] Assignee: SGS-Thomson Microelectronics, S.A., Gentilly, France

[21] Appl. No.: 742,298

[22] Filed: Aug. 8, 1991

[30] Foreign Application Priority Data

Aug. 10, 1990 [FR] France .................. 90 10247

[51] Int. Cl.$^5$ .............................. G11C 13/00
[52] U.S. Cl. ........................ 365/200; 365/230.01; 365/201
[58] Field of Search ............ 365/200, 201, 230.01

[56] References Cited

U.S. PATENT DOCUMENTS

| | | | |
|---|---|---|---|
| 4,907,203 | 3/1990 | Wada et al. | 365/201 |
| 4,939,694 | 7/1990 | Eaton et al. | 365/201 |
| 5,007,026 | 4/1991 | Gaultier et al. | 365/201 |

FOREIGN PATENT DOCUMENTS

| | | |
|---|---|---|
| 0050005 | 4/1982 | European Pat. Off. . |
| 0264893 | 4/1988 | European Pat. Off. . |
| WO90/03033 | 3/1990 | PCT Int'l Appl. . |

OTHER PUBLICATIONS

Altnether et al, "Testing Redundant Memories", *IEEE Electro*, vol. 7, pp. 26/3(1-6), New York (May 1982).
"Fast Write Scheme for Memory Test Patterns", Research Disclosure, No. 299, Disclosure No. 29929, p. 173, New York, New York (Mar. 1989).

*Primary Examiner*—Terrell W. Fears

[57] ABSTRACT

Integrated circuit memories provided with redundancy means enable the lines or columns of defective cells to be repaired. In order to avoid incompatibility between the addressing modifications due to a "grouped test" and those due to placing a redundant column or line into service, means are provided for the addressing, in grouped test mode, not only of several selected columns or lines of the memory but also of a redundant column or line that may have been put into service to replace a defective one of the selected columns or lines.

20 Claims, 2 Drawing Sheets

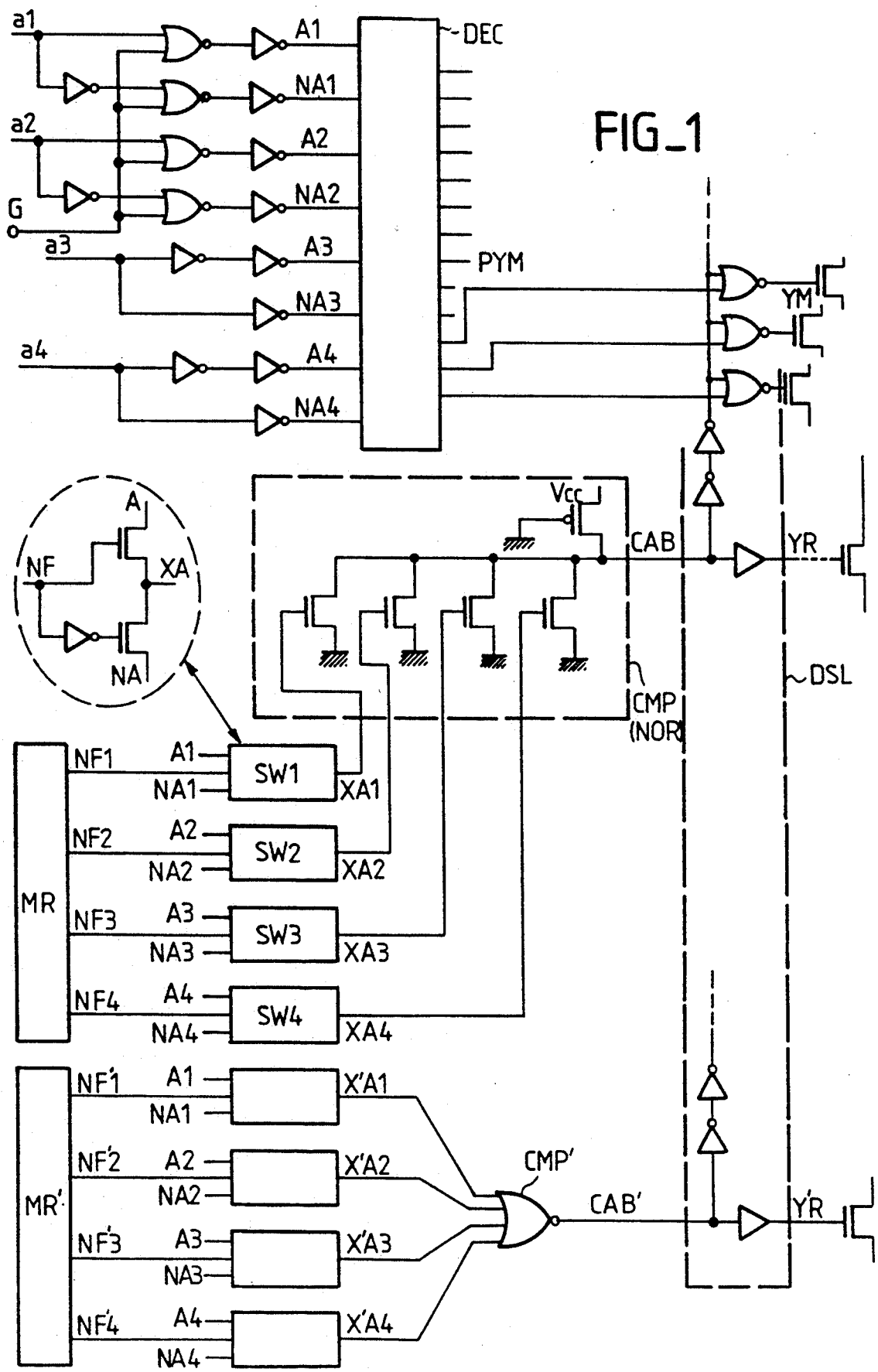
FIG_1

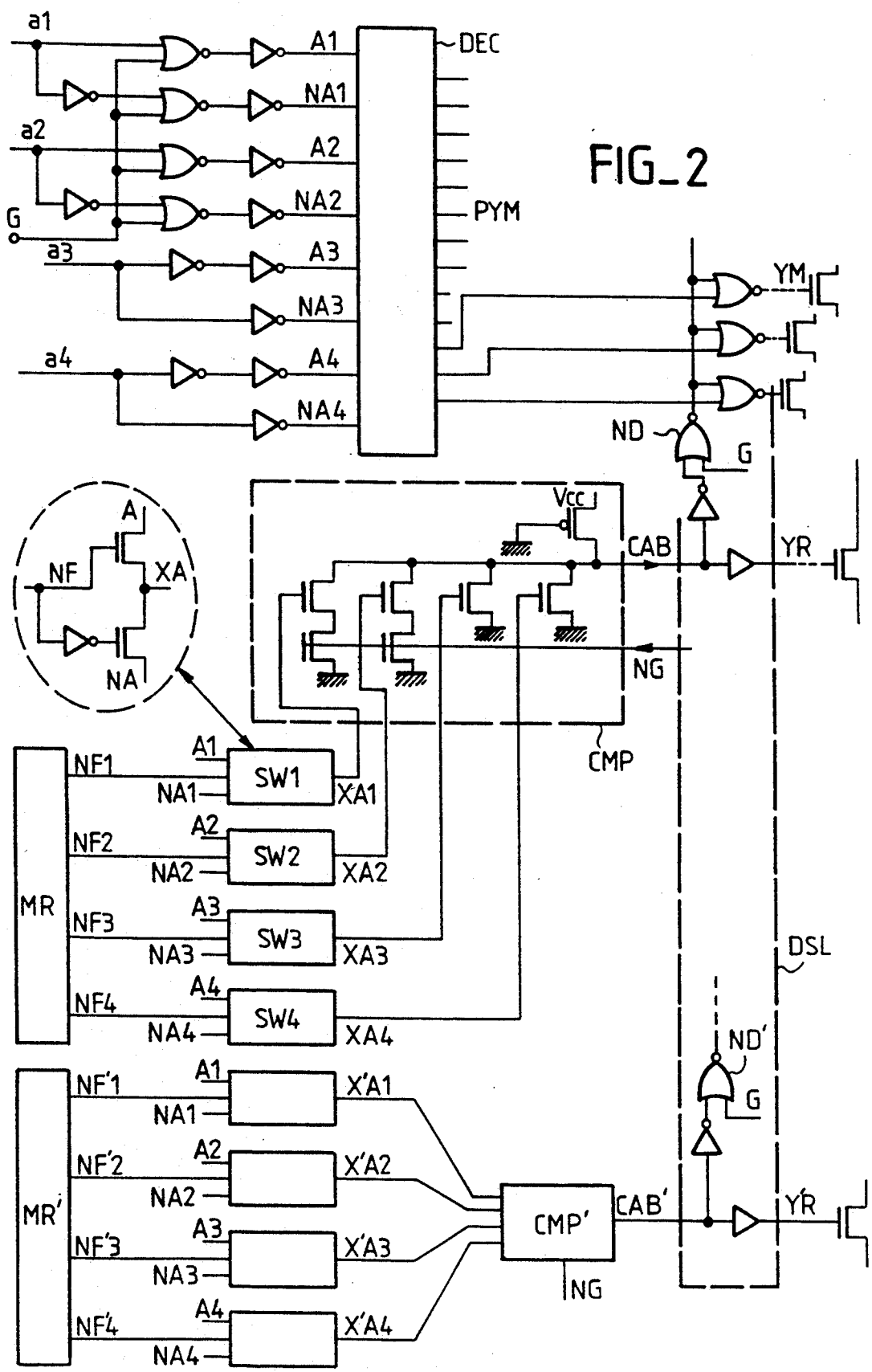
FIG_2

MEMORY INTEGRATED CIRCUIT WITH REDUNDANCY AND IMPROVED ADDRESSING IN TEST MODE

BACKGROUND OF THE INVENTION

1. Field of the Invention

The invention relates to memories made in integrated circuit form, especially but not exclusively electrically programmable non-volatile memories.

In large-capacity memories (having several tens of thousands of memory cells), it is the practice to improve manufacturing output by associating several redundancy columns (or lines) with the memory map. These redundancy lines or columns are designed to replace defective columns (or lines) of the memory maps. The following description shall be simplified by making reference only to columns, but it is also applicable to lines.

2. Description of the Prior Art

Integrated circuit memories, notably electrically programmable memories, are provided with redundancy means enabling the columns of defective cells to be repaired. The substitution of a redundancy column for a defective column should be transparent for the user, i.e. the user should be permitted to send an address corresponding to a defective column to the memory addressing input. The internal redundancy circuitry then takes over the task of neutralizing the defective column and of reading or writing a piece of information in a cell of a replacement column, instead of attempting to read or to write it in a cell of the defective column.

This transparency makes it necessary to place the following circuits at the input of the memory: defective address recognition circuits, deselection circuits to neutralize the defective columns, and routing circuits for routing towards the replacement columns.

All these circuits therefore substantially modify the initial decoding of the memory addresses. This decoding consists in associating a determined column with a determined input address.

Now, it so happens that, outside the normal mode of use of the memories (in which a user can read and write with complete transparency if redundant columns have been put into service), a second mode exists which is the test mode.

Indeed, it is necessary for all the memory cells to be tested before the circuit is declared worthy of being marketed. In particular, the test consists in programming all of the cells from their initial state (blank or virgin state) to a programmed state, and in ascertaining that they are correctly programmed. In fact, it is generally during this test that the defective columns are detected and that the replacement columns are put into service.

It may take some milliseconds to test a memory cell. However, integrated circuits are manufactured in batches, and each batch comprises tens of silicon wafers, each bearing several tens of chips, and each of these chips themselves bear several tens or hundreds of thousands of memory cells. The testing operations may therefore take a considerable amount of time since all the cells have to be methodically tested.

To reduce this testing time, it has been proposed that the cells be programmed according to a pattern (for example a chequerboard pattern) that enables the simultaneous programming of several columns of memory cells. In other words, in the testing mode, instead of writing individually in one column and then in another etc., an element of information is written simultaneously in parallel in several columns at a time, for example in 2 or 4 or 8 columns at a time. The testing time is correspondingly divided.

The term "grouped test" can be hereafter applied to this test mode in which several columns are programmed at a time.

According to the invention, it has been observed that it is not possible, in existing memories, to carry out a grouped test twice in succession although it is quite possible that such a test might be necessary under certain circumstances.

For example, the testing of an entire batch has to be recommenced if a false manoeuvre has been made during the testing of the batch or, furthermore, if the tester has broken down and if the malfunction has not been detected soon enough, etc.

Moreover the "grouped" test cannot be applied to batches having already been tested: indeed, redundancy columns have been (irreversibly) put into service in certain chips, and this putting into service is accompanied by major modifications in the internal addressing of the memory. Yet, the "grouped" test mode also calls for a modification in the internal addressing of the memory since it requires the simultaneous addressing of several columns.

It has been realized that the addressing modifications due to the putting into service of the redundancy columns were, in practice, incompatible with the addressing modifications required to carry out a grouped test mode. Therefore, it has not been possible to carry out a grouped test a second time, if the first test has led to replacement columns being put into service.

SUMMARY OF THE INVENTION

According to the invention, there is proposed a memory in which the means for addressing in grouped test mode, enabling the simultaneous addressing of a group of several columns, is capable of simultaneously selecting, with a view to their programming, not only the columns of this group but also a replacement column, if one of the columns of the group is defective and has been associated with a replacement column.

In this way, it is possible to recommence the grouped test. In the prior art, if a memory test had to be carried out a second time, it was necessary to pass into a single (non-grouped) test mode, i.e. column by column.

In a particular embodiment of the memory, there are:
- a decoder of column addresses receiving the bits of a column address at address inputs and the complements of these bits at complementary inputs;
- a redundancy memory for storing defective column addresses; and
- a circuit for the comparison of the received addresses and the defective column addresses with the circuit for the comparison of the received addresses and the defective addresses comprising a NOR gate with several inputs, each input receiving a bit, the logic level of which depends upon the identity between a bit received at an input of the decoder and a corresponding bit of the redundancy memory; and
- a selection circuit being provided for selecting a replacement column and for simultaneously deselecting a defective column when the output of the NOR gate indicates that a received address is identical with a defective address; the grouped test being controlled by a logic circuit which, in response to a grouped test control signal, places an identical logic level on at least one input and one corresponding complementary input of the decoder;

the grouped test control signal being applied to the comparison circuit to prevent the replacement column from being systematically put out of service during the grouped test.

BRIEF DESCRIPTION OF THE DRAWINGS

Other features and advantages of the invention will appear from the following detailed description, made with reference to the appended drawings, of which:

FIG. 1 shows a memory circuit with redundancy, which does not permit a grouped test after the redundancy has been put into service;

FIG. 2 shows a memory circuit according to the invention, enabling a grouped test even after the redundancy has been put into service.

MORE DETAILED DESCRIPTION

FIG. 1 shows the overall architecture of an integrated circuit memory which does not permit a grouped test after the redundancy has been put into service. The example shown is that of a memory with addressing of the columns by four address bits, with two redundancy columns capable of replacing two defective columns, and with a grouped test mode enabling the programming of four columns at a time. Naturally, this embodiment is given purely by way of a simplified example, the number of address bits and columns being far greater in practice.

The memory map itself, with its lines and columns of cells, has not been shown; access to the columns of memory cells of the memory map is established by a column address decoder DEC, the outputs PYM of which are equal in number to the number of memory columns: each output line enables the selection, when it is at the appropriate logic level, of a particular memory column.

At address bit inputs and at complementary inputs respectively, the decoder receives address bits A1, A2, A3, A4 and complements NA1, NA2, NA3, NA4 of said bits.

A given column is selected by the decoder for a given address. However, if an input and the corresponding complementary input (for example A1 and NA1) of the decoder are forced to the same logic level 1 (instead of complementary levels 1 and 0), two columns are selected. And if two inputs and the two corresponding complementary inputs (for example A1 and A2, and NA1 and NA2) are all forced to the same logic level 1, then four columns are selected simultaneously. The four columns thus simultaneously selected are defined by the other address bits (A3 and A4 herein).

This is what is put to profitable use to carry out, in the test mode, a "grouped" test with the simultaneous programming of several columns.

To this end, a grouped test control signal G is applied to a set of logic gates (NOR gates) interposed between the address inputs of the memory and the inputs of the decoder. When G is at the logic level 1, a level 1 is applied, both to inputs A1, A2 and to complementary inputs NA1, NA2 of the decoder.

When G=0 inputs NA1 and NA2 are the complements of inputs A1 and A2. The signal G does not act on the other address bits in this embodiment, where the grouped test consists in programming four columns at a time.

For the repair of the defective columns, the memory is organized as follows: a deselection circuit DSL enables the deselection of the column designated by the decoder and the selection, as a substitute, of a replacement column. This circuit DSL receives outputs PYM of the decoder and a deselection control signal CAB. If CAB is at logic level 1, the output PYM is inhibited and no longer enables the selection of the column designated by the decoder. The signal CAB is provided by a comparison circuit CMP, and is at 1 when the address presented to the input of the decoder is a defective column address.

More precisely, the circuit DSL receives outputs PYM which designate the column to be selected and, under the control of the deselection signal CAB, it provides as many outputs YM which are control lines for the selection of the memory columns and an additional output YR which is a control line for the selection of a first redundant column.

In the example shown, provision has in fact been made, for two redundancy columns, for example one associated with one half of the columns and the other with the other half, or both associated with all the columns. The signal CAB enables the deselection of a defective column to select instead the first replacement column. This selection is made by the control line YR. A signal CAB' enables the deselection of a defective column in order to select another replacement column by activating another control line YR'.

The addresses of defective columns, identified during the testing of the memory, are stored in redundancy memories in the form of batteries of fuses or unerasable electrically programmable memories (UPROMs). A first four-bit address is stored in a memory zone MR associated with the first replacement column. Another address may be stored in a second redundancy memory zone MR' associated with the second replacement column. These two addresses represent the addresses of two defective columns of the memory.

The deselection signal CAB is prepared by comparison between the address received and the address stored in the memory MR. The deselection signal CAB' is prepared by comparison between the address received and the address stored in the memory MR'. The comparison is made using circuits organized as follows: the defective column address bits, represented by outputs NF1, NF2, NF3, NF4, of the memory MR, are each used to control a respective routing SW1, SW2, SW3, SW4. Each routing also receives the signals present a respective input and at the corresponding complementary input of the decoder. Thus, routing SW1 receives NF1 (the first defective column address bit) as its control signal, and signals A1 (the first input of the decoder DEC) and NA1 (the first complementary input of the decoder) as signals to be routed. Depending upon the state of NF1, either A1 or NA1 is routed to the output of SW1. The output signal XA1 of the routing SW1 is then equal to zero if the address bit stored corresponds to the address bit received at the memory input. When all the address bits stored in the memory MR correspond precisely to the address bits received by the memory, all output signals XA1 to XA4 of the routings connected to the redundancy memory output go to 0. The deselection signal CAB is then activated. A simple NOR gate (designated by CMP in FIG. 1 and FIG. 2)

receiving all the signals XA1 to XA4 gives the signal CAB at its output. This NOR gate is constituted here by transistors in parallel, the gates of which receive a respective one of the signals XA1 to XA4.

The preparation of the signal CAB' carried out with the contents of the memory MR' is identical.

In practice, to prepare XA1 from NF1, from A1 and from NA1, a small two-transistor, N channel routing circuit SW1 is used in series between A1 and NA1. The gates of these two transistors are controlled by NF1 and the reverse of NF1 respectively. The other routing circuits are identical.

Now, this circuit gives XA1 as desired (XA1=0 if the address bit received corresponds to the bit stored) only if A1 and NA1 are truly complementary signals. If A1 and NA1 are both equal to 1, XA1 cannot be other than 1. And if XA1 (or XA2) is equal to 1, then signal CAB can no longer go to 1.

This results in the fact that the redundancy column cannot be selected once A1 and NA1 are both equal to 1. Whereas this is what happens in the grouped test mode: A1 and NA1 are both equal to 1, as are A2 and NA2.

During the first memory test, this fact is of no importance. No redundancy column has been put into service. But if it is sought to make a second grouped test, after the redundancy columns have been put into service because defective columns exist, then the defective columns will be tested again, but there will obviously no longer be any possibility of repairing them since they will in fact have already been repaired. And even if they were to be replaced again, it would not be possible, in any case, to ascertain (in grouped test mode) that the repairs had been done properly.

Therefore it will be understood that it is not possible to redo a grouped test with the conventional circuit of FIG. 1.

With the circuit of FIG. 2, it is now possible to repeat the grouped test.

To this end, it is provided that the comparison circuits (NOR gate CMP and routings SW1 to SW4) be modified to prevent the systematic deselection of the redundancy column in the grouped test mode.

In the example described, the NOR gate CMP is modified as follows: it receives a complement NG of the signal G for the grouped test control. This signal NG prohibits the zero-setting of the signal CAB under the effect of the signals XA1 and XA2, i.e. of the output signals of the routings SW1 and SW2 which correspond to the address bits grouped during the grouped test.

Thus, when bits A3 and A4 correspond to a defective column address, the signal CAB will go to 1 and will enable the selection of the redundant column. Indeed, the defective column is then one of the four columns selected by the grouped test, and it must be replaced by the redundant column.

However, the four grouped columns should not be deselected since they must be tested (while the passage of the signal CAB to 1 deselects all of them). This is why, in the deselection circuit DSL, a logic gate ND is interposed receiving the signal CAB or its complement and the signal G of the grouped test or its complement. This gate neutralizes the deselection when the signal G indicates that the operation is in grouped test mode. The gate ND prevents the signal CAB from affecting the transmission of the output signals PYM from the decoder to the columns of the memory map.

Naturally, the same arrangements are made for the preparation and the transmission of the signal CAB': the modification of a NOR gate CMP' by the signal NG and the interposing of a logic gate ND' controlled by G.

What is claimed is:

1. An integrated circuit memory with redundancy circuits configured to selectably to replace defective memory cell columns by redundancy columns, comprising:
    addressing means enabling each column to be addressed individually in normal mode and enabling a simultaneous addressing and programming, in grouped test mode, of a group of several columns;
    wherein in grouped test mode, said addressing means is not only capable of selecting and programming a group of columns, but also, if a column of the group of columns is considered to be defective and is associated with a replacement column, programming selection of said replacement column.

2. An integrated circuit memory with redundancy circuits to replace defective memory cell columns by redundancy columns, comprising:
    addressing means enabling each column to be addressed individually in normal mode and enabling a simultaneous addressing, in grouped test mode, of a group of several columns with a view to their simultaneous programming,
    wherein, in grouped test mode, said addressing means is capable of selecting, with a view to their programming, not only a group of columns, but if a column of the group of columns is considered to be defective and is associated with a replacement column, also said replacement column;
    a decoder of column addresses receiving column address bits at address inputs and complements of said bits at complementary inputs;
    a redundancy memory for comparing received addresses and the defective column addresses; and
    a circuit for comparing received addresses and the defective columns addresses;
    said comparison circuit comprising a NOR gate with an output and several inputs, each input receiving a bit, the logic level of which depends on the identity between a bit received at an input of the decoder and a corresponding bit of the redundancy memory;
    means for selecting a replacement column and for simultaneously deselecting a defective column when the NOR gate output indicates that a received address is identical with a defective address; the grouped test being controlled by a logic circuit which, in response to a grouped test control signal, places an identical logic level on at least on input and one corresponding complementary input of the decoder; the grouped test control signal being applies to the comparison circuit to prevent the replacement column from being systematically put out of service during the grouped test.

3. An integrated circuit memory comprising:
    an address decoder having address inputs and complementary inputs, and having a plurality of outputs corresponding to the number of series of memory cells in said memory, each of said complementary inputs being associated with a respective one of said address inputs;
    a source of a grouped test control signal corresponding to the occurrence of a ground test mode, an address logic circuit to receive any grouped test control signal, to receive the address bits for a series of memory cells, in the absence of said grouped test mode to apply said address bits to said address inputs and to apply complements of said bits to said complementary inputs to thereby cause said address decoder to select the series of memory cells corresponding to the address bits received by said address logic circuit, and in said grouped test mode to apply said address bits to at least some of said address inputs and to apply complements of said bits to at least some of said complementary inputs while placing an identical logic level on at least one address input and its corresponding complementary input to thereby cause said address decoder to select in said grouped test mode a plurality of series of memory cells;

a redundancy memory for storing an address of a series of memory cells which contains a defective memory cell;

a comparison circuit for comparing an address, which is applied to said address decoder by said address logic circuit, with an address stored in said redundancy memory, for producing a deselection signal when the address applied to said address decoder corresponds to a stored address of a series of memory cells which contains a defective memory cell, said comparison circuit being responsive to the occurrence of a grouped test mode to prevent the occurrence of an identical logic level in the thus applied address from affecting said deselection signal;

a selection circuit for selecting a replacement series of memory cells and for simultaneously deselecting, in the absence of the grouped test mode, a series of memory cells represented by the address applied to said address decoder when said deselection signal indicates that the address applied to said address decoder is identical with an address of a series of memory cells which contains a defective memory cells; and a neutralizing logic circuit for neutralizing, in the presence of the grouped test mode, the deselection by said selection circuit.

4. An integrated circuit memory in accordance with claim 3 wherein each said series of memory cells is a column of memory cells in said memory.

5. An integrated circuit memory in accordance with claim 3 wherein said comparison circuit comprises a NOR gate having an output and a plurality of inputs, each input of said NOR gate receiving a bit, the logic level of which depends on the identity between a bit received at an input of the address decoder and a corresponding bit of the redundancy memory.

6. An integrated circuit memory in accordance with claim 3 wherein said address logic circuit comprises at least one pair of NOR circuits, each pair of NOR circuits comprising a first NOR circuit and a second NOR circuit, each NOR circuit having first and second inputs, the source of said grouped test control signal being connected to the first input of each of said NOR circuits, one of the address bits received by said address logic circuit being connected to the second input of the first NOR circuit in a respective pair of NOR circuits while the complement of that one address bit is connected to the second input of the second NOR circuit in that pair of NOR circuits, the output of the first NOR circuit in a pair being connected to the corresponding address input of said address decoder while the output of the second NOR circuit in that pair is connected to the corresponding complementary input of said address decoder.

7. An integrated circuit memory in accordance with claim 6 wherein the number of pairs of NOR circuits in said address logic circuit is at least two and is less than the number of address bits received by said address logic circuit for a series of memory cells.

8. An integrated circuit memory in accordance with claim 3 wherein said comparison circuit comprises a plurality of routings corresponding in number to the address bits in an address stored in said redundancy memory, each of said routings having three inputs and an output, the first input of each of said routings being connected to receive the address bit applied to a respective one of the address inputs of said address decoder, the second input of each of said routings being connected to receive the address bit applied to the corresponding complementary input of said address decoder, and the third input of each of said routings being connected to receive the corresponding address bit of an address stored in said redundancy memory, each routing producing a first output signal when the signals applied to its first and second inputs are complementary to each other and the stored address bit applied to its third input is the same as the corresponding address bit received by said address logic circuit, each routing producing a second output signal when either the signals applied to its first and second inputs are not complementary to each other or the stored address bit applied to its third input is not the same as the corresponding address bit received by said address logic circuit.

9. An integrated circuit memory in accordance with claim 8 wherein said comparison circuit further comprises a NOR circuit having an output and having a plurality of input paths, with each of the input paths being connected to the output of a respective routing, each input path having at least a first transistor and each input path which is connected to a routing which may receive an identical logic level on its first transistor and each input path which is connected to a routing which may receive an identical logic level on its first and second inputs having a second transistor connected in series with the respective first transistor between a voltage source and an electrical ground, the output of a routing being connected to the gate of the first transistor in the associated input path of the NOR circuit, a complementary of the grouped test control signal being connected to the gate of each second transistor in an input path of the NOR circuit, with said deselection signal being produced at the output of said NOR circuit.

10. An integrated circuit memory in accordance with claim 3 where said neutralizing logic circuit has first and second inputs and an output, with said deselection signal being applied to the first input of said neutralizing logic circuit and a signal responsive to said grouped test control signal being applied to the second input of said neutralizing logic circuit.

11. An integrated circuit memory in accordance with claim 3 wherein each said series of memory cells is a column of memory cells in said memory, wherein said address logic circuit comprises at least one pair of NOR circuits, each pair of NOR circuits comprising a first NOR circuit and a second NOR circuit, each NOR circuit having first and second inputs, the source of said grouped test control signal being connected to the first input of each of said NOR circuits, one of the address bits received by said address logic circuit being connected to the second input of the first NOR circuit in a respective pair of NOR circuits while the complement of that one address bits is connected to the second input of the second NOR circuit in that pair of NOR circuits, the output of the first NOR circuit in a pair being connected to the corresponding address input of said address decoder while the output of the second NOR circuit in that pair is connected to the corresponding complementary input of said address decoder, thereby enabling each column to be addressed individually in normal mode and enabling a simultaneous addressing, in grouped test mode, of a group of several columns with a view to their simultaneous programming.

12. An integrated circuit memory in accordance with claim 11 wherein the number of pairs of NOR circuits in said address logic circuit is at least two and is less than the number of address bits received by said address logic circuit for a series of memory cells.

13. An integrated circuit memory in accordance with claim 12 wherein said comparison circuit comprises a plurality of routings corresponding in number to the address bits in an address stored in said redundancy memory, each of said routings having three inputs and an output, the first input of each of said routings being connected to receive the address bit applied to a respective one of the address inputs of said address decoder, the second input of each of said routings being connected to receive the address bit applied to the corresponding complementary input of said address decoder, and the third input of each of said routings being connected to receive the corresponding address bit of an address stored in said redundancy memory, each routing producing a first output signal when the signals applied to its first and second inputs are complementary to each other and the stored address bit applied to its third input is the same as the corresponding address bit received by said address logic circuit, each routing producing a second output signal when either the signals applied to its first and second inputs are not complementary to each other or the stored address bit applied to its third input is not the same as the corresponding address bit received by said address logic circuit.

14. An integrated circuit memory in accordance with claim 13 wherein said comparison circuit further comprises a NOR circuit having an output and having a plurality of input paths, with each of the input paths being connected to the output of a respective routing, each input path having at least a first transistor and each input path which is connected to a routing which may receive an identical logic level on its first and second inputs having a second transistor connected in series with the respective first transistor between a voltage source and an electrical ground, the output of a routing being connected to the gate of the first transistor in the associated input path of the NOR circuit which is contained in said comparison circuit, a complementary of the grouped test control signal being connected to the gate of each second transistor in an input path of the NOR circuit which is contained in said comparison circuit, with said deselection signal being produced at the output of the NOR circuit which is contained in said comparison circuit.

15. An integrated circuit memory in accordance with claim 14 wherein said neutralizing logic circuit has first and second inputs and an output, with said deselection signal being applied to the first input of said neutralizing logic circuit and a signal responsive to said grouped test control signal being applied to the second input of said neutralizing logic circuit.

16. An integrated circuit memory in accordance with claim 15 wherein the signal applied to the second input of said neutralizing logic circuit is complementary to said grouped test control signal.

17. An integrated circuit memory in accordance with claim 3 wherein said comparison circuit comprises a plurality of routings corresponding in number to the address bits in an address stored in said redundancy memory, each of said routings having three inputs and an output, the first input of each of said routings being connected to receive the address bit applied to a respective one of the address inputs of said address decoder, the second input of each of said routings being connected to receive the address bit applied to the corresponding complementary input of said address decoder, and the third input of each of said routings being connected to receive the corresponding address bit of an address stored in said redundancy memory, each routing producing a first output signal when the signals applied to its first and second inputs are complementary to each other and the stored address bit applied to its third input is the same as the corresponding address bit received by said address logic circuit, each routing producing a second output signal when either the signals applied to its first and second inputs are not complementary to each other or the stored address bit applied to its third input is not the same as the corresponding address bit received by said address logic circuit; and wherein said neutralizing logic circuit has first and second inputs and an output, with said deselection signal being applied to the first input of said neutralizing logic circuit and a signal responsive to said grouped test control signal being applied to the second input of said neutralizing logic circuit.

18. An integrated circuit memory in accordance with claim 17 wherein said comparison circuit further comprises a NOR circuit having an output and having a plurality of input paths, with each of the input paths being connected to the output of a respective routing, each input path having at least a first transistor and each input path which is connected to a routing which may receive an identical logic level on its first and second inputs having a second transistor connected in series with the respective first transistor between a voltage source and an electrical ground, the output of a routing being connected to the gate of the first transistor in the associated input path of the NOR circuit, a complementary of the grouped test control signal being connected to the gate of each second transistor in an input path of the NOR circuit, with said deselection signal being produced at the output of said NOR circuit.

19. An integrated circuit memory in accordance with claim 18 wherein said address logic circuit comprises at least one air of NOR circuits, each pair of NOR circuits in the address logic circuit comprising a first NOR circuit and a second NOR circuit, each NOR circuit in the address logic circuit having first and second inputs, the source of said grouped test control signal being connected to the first input of each of said NOR circuits in the address logic circuit, one of the address bits received by said address logic circuit being connected to the second input of the first NOR circuit in a respective pair of NOR circuits in the address logic circuit while the complement of that one address bit is connected to the second input of the second NOR circuit in that pair of NOR circuits in the address logic circuit, the output of the first NOR circuit in a pair in the address logic circuit being connected to the corresponding address input of said address decoder while the output of the second NOR circuit in that pair is connected to the corresponding complementary input of said address decoder.

20. An integrated circuit memory in accordance with claim 19 wherein the number of pairs of NOR circuits in said address logic circuit is at least two and is less than the number of address bits received by said address logic circuit for a series of memory cells.

* * * * *